United States Patent
Anderson et al.

(10) Patent No.: US 11,984,720 B2
(45) Date of Patent: May 14, 2024

(54) POWER GRID PROTECTION VIA TRANSFORMER NEUTRAL BLOCKING SYSTEMS AND TRIGGERED PHASE DISCONNECTION

(71) Applicant: TechHold, LLC, Minneapolis, MN (US)

(72) Inventors: David Anderson, Excelsior, MN (US); Greg Fuchs, River Falls, WI (US); Frederick R. Faxvog, Medina, MN (US); George Anderson, Champlin, MN (US); Wallace Jensen, Centerville, MN (US)

(73) Assignee: TechHold LLC, Minneapolis, MN (US)

( * ) Notice: Subject to any disclaimer, the term of this patent is extended or adjusted under 35 U.S.C. 154(b) by 417 days.

(21) Appl. No.: 17/100,412

(22) Filed: Nov. 20, 2020

(65) Prior Publication Data

US 2021/0075213 A1   Mar. 11, 2021

Related U.S. Application Data

(63) Continuation of application No. 16/586,219, filed on Sep. 27, 2019, now Pat. No. 11,469,590.

(Continued)

(51) Int. Cl.
*H02H 7/26* (2006.01)
*H02H 7/045* (2006.01)
(Continued)

(52) U.S. Cl.
CPC .......... *H02H 7/261* (2013.01); *H02H 7/0455* (2013.01); *G01R 31/50* (2020.01);
(Continued)

(58) Field of Classification Search
CPC ....... H02H 7/261; H02H 7/0455; G01R 31/50
See application file for complete search history.

(56) References Cited

U.S. PATENT DOCUMENTS 4,580,186 A * 4/1986 Parker ................... H02H 3/165
361/50
5,930,099 A * 7/1999 Legro .................... E21B 47/13
361/111

(Continued)

FOREIGN PATENT DOCUMENTS

| CN | 203774759 U | 8/2014 |
| JP | 58-103823 A | 6/1983 |
| JP | 3-207224 A | 9/1991 |

OTHER PUBLICATIONS

Partial International Search Report for Application No. PCT/US2019/053563 dated Jan. 17, 2020.

(Continued)

*Primary Examiner* — Scott Bauer
(74) *Attorney, Agent, or Firm* — Merchant & Gould P.C.

(57) ABSTRACT

A protection circuit is disclosed. The protection circuit includes a direct current (DC) blocking component electrically connected between a neutral of the transformer and a ground, and an overvoltage protection device electrically connected in parallel with the DC blocking component. The overvoltage protection device is constructed to repeatably and reliably provide overvoltage protection in response to a voltage at the transformer neutral above a threshold. The DC blocking component has an impedance below a predetermined value, thereby effectively grounding the neutral of the transformer. The DC blocking component is persistently maintained in connection to the transformer neutral.

17 Claims, 14 Drawing Sheets

Related U.S. Application Data

(60) Provisional application No. 62/738,826, filed on Sep. 28, 2018.

(51) Int. Cl.
*G01R 31/50* (2020.01)
*H02H 1/04* (2006.01)
*H02H 3/16* (2006.01)
*H02H 3/52* (2006.01)

(52) U.S. Cl.
CPC ............... *H02H 1/04* (2013.01); *H02H 3/165* (2013.01); *H02H 3/52* (2013.01)

(56) References Cited

U.S. PATENT DOCUMENTS

| | | |
|---|---|---|
| 7,589,943 B2 | 9/2009 | Ramirez et al. |
| 8,035,935 B2 | 10/2011 | Ramirez et al. |
| 8,487,635 B1 | 7/2013 | Paul |
| 8,537,508 B2 | 9/2013 | Faxvog et al. |
| 8,773,107 B2 | 7/2014 | Jackson et al. |
| 8,860,402 B2 | 10/2014 | Jackson et al. |
| 8,878,396 B2 | 11/2014 | Faxvog et al. |
| 9,077,172 B2 | 7/2015 | Faxvog et al. |
| 10,199,821 B2 | 2/2019 | Fuchs et al. |
| 10,985,559 B2 | 4/2021 | Anderson et al. |
| 11,038,347 B2 | 6/2021 | Fuchs et al. |
| 11,108,222 B2 | 8/2021 | Jensen et al. |
| 11,621,557 B2 | 4/2023 | Fuchs et al. |
| 11,664,653 B2 | 5/2023 | Anderson et al. |
| 2002/0149898 A1 | 10/2002 | Durth et al. |
| 2003/0030957 A1 | 2/2003 | Schmidt et al. |
| 2005/0068709 A1 | 3/2005 | Kouwenhoven et al. |
| 2007/0058319 A1 | 3/2007 | Frescaline et al. |
| 2011/0101989 A1 | 5/2011 | Hyde et al. |
| 2011/0102960 A1 | 5/2011 | Podporkin |
| 2012/0019962 A1 | 1/2012 | Faxvog et al. |
| 2013/0038977 A1 | 2/2013 | Lange et al. |
| 2013/0193979 A1 | 8/2013 | Gajic |
| 2014/0334054 A1* | 11/2014 | Fuchs ............... H02H 9/06 361/112 |
| 2015/0311697 A1* | 10/2015 | Faxvog ............... H02H 7/04 361/35 |
| 2016/0197469 A1* | 7/2016 | Fuchs ............... H02H 7/04 361/35 |
| 2017/0222433 A1 | 8/2017 | Fuchs et al. |
| 2018/0183235 A1 | 6/2018 | Fuchs et al. |
| 2018/0226796 A1 | 8/2018 | Anderson et al. |
| 2020/0106262 A1 | 4/2020 | Anderson et al. |

OTHER PUBLICATIONS

International Search Report and Written Opinion for Application No. PCT/US2019/053563 dated Mar. 12, 2020.

* cited by examiner

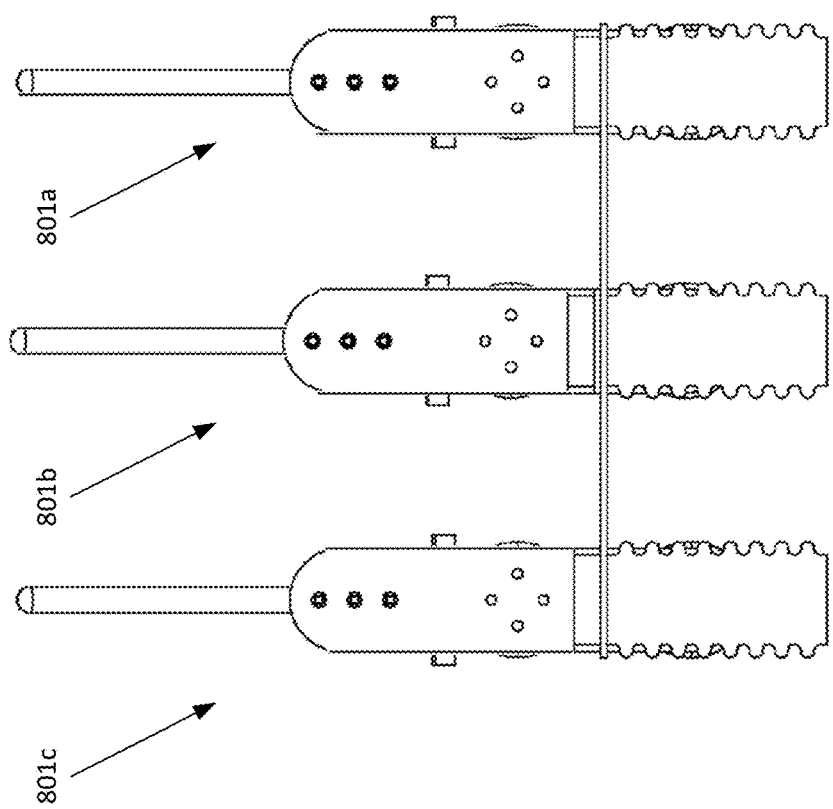
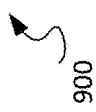
*FIGURE 8D*

POWER GRID PROTECTION VIA TRANSFORMER NEUTRAL BLOCKING SYSTEMS AND TRIGGERED PHASE DISCONNECTION

CROSS-REFERENCE TO RELATED APPLICATIONS

This application is a continuation of U.S. patent application Ser. No. 16/586,219, filed on Sep. 27, 2019; which claims the benefit of U.S. Provisional Patent Application No. 62/738,826, filed on Sep. 28, 2018, the disclosures of which are hereby incorporated by reference in their entirety.

TECHNICAL FIELD

The present disclosure relates generally to electrical protection devices for electrical equipment; in particular, the present disclosure relates to systems for power grid protection, e.g., transformer neutral blocking circuits and voltage-triggered transformer phase disconnection.

BACKGROUND

Electrical systems, and in particular high-voltage, high-power electrical systems, are subject to damage when substantial, unexpected electrical events occur. Particular examples of electrical systems and devices that are susceptible to damage include high-voltage transformers, generators, breakers and reactive power support equipment that is installed in the power grid.

Exposure to electromagnetic fields can cause various types of damage to electrical systems, particularly those included in sensitive circuits such as the power grid. For example, electromagnetic pulse (EMP) and geomagnetic disturbance (GMD) events can cause interference or damage to electrical equipment, causing that equipment to malfunction or rendering it nonoperational. Electrical equipment can also be destroyed by strong EMP or geomagnetic storms. The detailed characteristics of EMP radiation are described in Military Standard 188-125, entitled "High Altitude Electromagnetic Pulse Protection for Ground Based C41 Facilities Performing Critical, Time-Urgent Missions" and Oak Ridge National Laboratories Meta-R-321, "The Late-Time (E3) High-Altitude Electromagnetic Pulse (HEMP) and Its Impact on the U.S. Power Grid." Generally, such types of electromagnetic fields can induce current in a power grid, such as may include high-voltage transformers.

Further examples of damage can occur in the event of geomagnetically induced current (GIC). In such instances, substantial induced current may also be experienced at electrical equipment; however, this current has a more gradual appearance within the power grid (over the course of seconds/minutes, rather than within milliseconds). The detailed characteristics of geomagnetic storms are described in Oak Ridge National Laboratories Meta-R-319 "Geomagnetic Storms and Their Impacts on the U.S. Power Grid." HVDC systems operating near AC grid systems can cause ground currents that can impact the AC grid system through the ground connections. One example is in ground return mode, where the HVDC systems can inject DC current into the earth electrode which may lead to stray DC currents flowing in the neutrals of nearby transformers.

Each of the above example causes of damage can result in failure of power grid electrical components, such as high voltage transformers. This can cause unwanted consequences, in the form of power outages for large populations/regions. Because these large transformers are expensive and generally difficult to relocate, it can take substantial time to complete any repair on or replacement of such transformers.

EMP E3 events include components that occur relatively rapidly (within milliseconds), while GIC-type events occur more gradually. As such, protection systems for power grid components are either configured to protect against a subset of types of events, or constructed to respond to various types of events and therefore require fast and slow response times. Because these events induce signals that are at a low frequency compared to the 50 Hz or 60 Hz frequency associated with power system signals, they are considered direct current (DC) or quasi-DC.

An additional consideration is that equipment that is designed to protect power grid components from EMP E3 must be resistant and able to operate through the earlier E1 and E2 components of EMP. This requires specialized shielding and design specifications. Mil-Std 188-125 describes those conditions and remediations necessary, as well as Military Standard 464, "Electromagnetic Environmental Effects Requirements For Systems." The shielding and protections required to make electronics resistant to EMP E1 generally protects it against other damaging high frequency events, such as intentional electromagnetic interference (IEMI) as described in IEC 61000-2-13 "High-power electromagnetic (HPEM) environments—Radiated and conducted."

One example protection system useable to protect against EMP/IEMI and GIC events is described in U.S. Pat. No. 8,878,396. That patent describes a system in which the neutral connection is limited to the direct current (DC) blocking component of a circuit between a transformer neutral and ground. During typical operation, a parallel circuit path directly connected to ground is maintained closed, and fast-acting switches open in the event of EMP/IEMI or GIC events.

Although the system described in the referenced patent is effective in protecting against such potentially-damaging events, some power grid operators prefer to avoid use of switching components due to a perception that a switched-in component may be less reliable than one which is permanently included within a protection circuit. As such, such system operators may elect to adopt other solutions which do not require use of a switch to selectively introduce circuit components into a protection circuit.

Protection circuits and related systems that do not require active detection of damaging events and switching to react to such events are considered "passive systems" in the present disclosure. These passive systems can incorporate an automatic bypass switch to bypass the DC-blocking component in a variety of conditions ("passive systems with an automatic bypass") or be constructed without an automatic bypass switch ("fully passive systems"). These may be contrasted to those "active systems" which automatically, selectively introduce a DC blocking component into the circuit between a neutral of the transformer and a ground.

A variety of passive systems exist. A common component is an overvoltage protection device (e.g., using a spark gap or metal oxide varistor (MOV)) that may be included between a transformer neutral and ground. In most systems, however, existing overvoltage protection devices are not constructed to withstand multiple fault events. Because of the very high current associated with faults on the bulk power system, the overvoltage protection system must be bypassed and reset or repaired before the system is put back into operation. Spark gaps generally erode significantly under the stresses of a fault event, and that erosion of material significantly changes the breakdown voltage that the gap will fire at, reducing or eliminating its effectiveness as an overvoltage protection device by increasing the breakdown voltage to an unacceptably high level. In the case of solid-state devices, such as MOV or thyristors, the high current causes the devices to heat up and require a long period of cooling before being ready to enter service again. This is one of the reasons passive systems have required an automatic bypass switch.

Still further, existing passive protection circuits have drawbacks with respect to their operation when damaging events are not present. For example, for linear resistors included in such passive systems "full time" (i.e., are not switched in/out by bypass switching, or the like), during typical operation there remains a substantial resistance at the connection between a transformer neutral and ground. This can cause problematic effects, such as: limited effectiveness unless relatively high values of resistance are used, the system no longer has effectively-grounded neutrals, with accompanying adverse effects on transformer insulation levels and ground fault relaying schemes. Also, if a neutral current (due to system unbalance) is not zero, the neutral resistor could have $I^2R$ losses that may require forced cooling. Still further, linear resistance will not prevent harmonics due to GIC. Transformers may still saturate during GMD or EMP events, inducing harmonics that will travel into the distribution network causing business losses, customer equipment damage and if severe, voltage collapse.

Accordingly, there is no existing device which meets all requirements of power grid operators in terms of both perceived reliability and actual responsiveness to potentially damaging voltage/current events within the power grid. Furthermore, the existing passive devices only offer protection up to a point where the device reaches its DC voltage withstand limit and can no longer protect the transformer. This is concerning for scenarios where very large DC currents are expected such as from a large GMD or EMP event. In the case of such events, induced currents and voltages within the power grid may result in damage to a transformer and related circuitry, not just in the location being monitored but in other locations within the power grid.

For these and other reasons, improvements are desirable.

SUMMARY

In accordance with the following disclosure, the above and other issues are addressed by the following:

In a first aspect, a protection circuit is disclosed. The protection circuit includes a direct current (DC) blocking component electrically connected between a neutral of the transformer and a ground, and an overvoltage protection device electrically connected in parallel with the DC blocking component. The overvoltage protection device is constructed to repeatably and reliably provide overvoltage protection in response to a voltage at the transformer neutral above a threshold. The DC blocking component has an impedance below a predetermined value, thereby effectively grounding the neutral of the transformer. The DC blocking component is persistently maintained in connection to the transformer neutral.

In a second aspect, an electrical protection system includes a transformer assembly having one or more connections, each connection associated with a different power line phase of an alternating current power signal or all three phases of the alternating current power signal. The system further includes a voltage measuring device to transmit a signal upon detection of a voltage across the neutral of the transformer and ground, and at least one breaker electrically connected to a power line phase of the transformer. The system further includes a direct current neutral blocking circuit electrically connected between the transformer neutral and a ground. The system includes a processor to receive the signal from the voltage measuring device, the processor electrically connected directly or indirectly to at least one breaker and configured to send a signal to open at least one breaker electrically connected to the power line phase of the transformer upon receiving the signal from the voltage measuring device in response to a determination at the processor that the voltage across the transformer neutral and ground is above a predetermined threshold.

In some aspects, above the predetermined threshold, either the overvoltage protection device will fire or the DC voltage withstand limit of the DC blocking component and/or the transformer neutral insulation is at risk of being exceeded. An objective is to block as much DC current as possible and then safely open the large phase circuit breakers and de-energize the transformer, removing transformer from harm only when absolutely necessary before a DC voltage withstand limit is reached or an inrush of DC current begins to flow.

In still further aspects, a method of protecting a power grid against damage due to induced current or voltage at a neutral of a power grid transformer within the power grid is disclosed. The method includes detecting, at a transformer neutral of a first transformer within the power grid, a voltage having a characteristic indicative of potential damage to electrical equipment included within the power grid, and selecting one or more transformers other than the first transformer within the power grid, the one or more transformers being associated with phase breakers and control circuitry. The method further includes transmitting to the control circuitry associated with the one or more transformers an actuation command indicating to the control circuitry to open the phase breakers, thereby segmenting the power grid, in essence "shortening the line" which would result in a voltage level drop on the first transformer.

BRIEF DESCRIPTION OF THE DRAWINGS

FIGS. 8A-8D illustrate an example overvoltage protection device useable within the passive transformer neutral blocking circuit of FIGS. 1-7.

DETAILED DESCRIPTION

Figure 1:
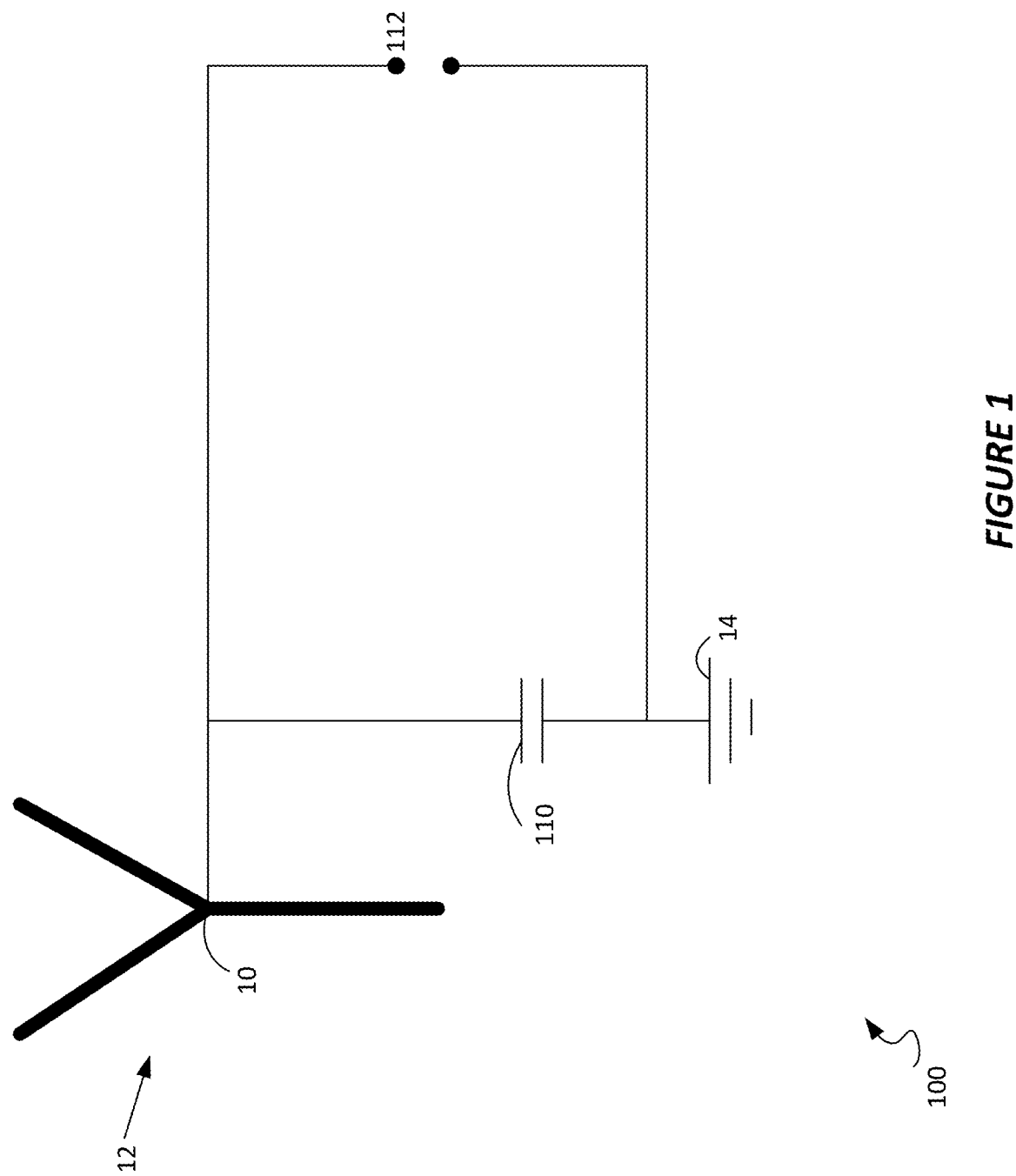
FIG. 1 is a perspective view of an example embodiment of a passive transformer neutral blocking circuit, according to a possible embodiment of the present disclosure, as installed at a power generation or distribution substation site.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure describes systems and methods for protecting power utility transformers and other electrical or electro-mechanical equipment from damaging DC currents and as a result harmonic content on a power line. Large DC neutral currents and harmonics can be the result of geomagnetic (solar) storms, high altitude electromagnetic E3 pulse (HEMP-E3), or HVDC operating in ground return mode.

Overall, the present disclosure describes methods and systems for passively blocking or reducing potentially damaging neutral DC currents and preventing the generation of harmonic content of a 50 Hz or 60 Hz power line source, to protect critical electrical equipment. The methods and systems described require very little maintenance and the DC blocking circuit does not need to utilize active components such as switches, allowing for protection that is persistently maintained. In addition, the systems and methods described employ a low impedance capacitor or capacitor bank(s) so as to provide an effectively grounded transformer, thereby avoiding potential problems within a power system related to threshold settings of relay protection systems. An electrical circuit is effectively grounded when it meets the definition for grounding set forth in the IEEE Standard, C62.91.

In accordance with the present disclosure, a protection circuit that is referred to herein as having a "persistently maintained" direct current blocking feature means that such a direct current block remains connected to the neutral of a transformer and not bypassed, at least while it is in operation. For purposes of illustration, while a device having a manual bypass switch for maintenance purposes (i.e., for manual disconnection during non-operational periods to be serviced) is persistently maintained, a device having an automated switch or electronically controlled switch that allows for switching between operational modes while the transformer is in operation would not persistently maintain the DC blocking component at the transformer neutral. Still further, a device having an automated switch that is used only during maintenance operations but which is configured to not be activated to bypass a direct current blocking component responsive to operating conditions would still be a circuit that persistently maintains a direct current blocking feature during operation of that circuit.

The passive transformer neutral blocking system disclosed herein provides a grounding scheme that is compatible with standard transformer grounding schemes and therefore, in typical circumstances, would not require changes to power system relay settings. When either high DC (or quasi DC) currents or voltages, or high harmonic power content is present, a DC blocking component blocks or attenuates the DC or quasi DC current in the system. Blocking the quasi DC or DC currents prevents half cycle saturation of transformers and thereby protects them from excessive reactive power losses, overheating and damage. Additionally, blocking the DC currents prevents the generation of harmonics in partially saturated transformers. Such power harmonics can potentially trip power system relays, which in turn can cause local or wide area power outages. Whenever an overvoltage event occurs, or successive overvoltage events occur within a short period of time, a passive overvoltage protection device (OVPD) may operate to protect components from overvoltage. The overvoltage protection devices, according to various example embodiments of the present disclosure, can include one or more of the following: a spark gap, a metal oxide varistor, a silicon carbon varistor, a variable resistor, a surge arrestor, or any other suitable component designed to form a path to ground and away from the protected components for signals over a threshold voltage.

In example embodiments, the systems and methods of the present disclosure allow for blocking of geomagnetically induced currents (GIC), prevent generation of harmonic signals, while maintaining a low impedance, low resistance connection to ground to maintain an effective alternating current (AC) ground connection for a power line transformer. Accordingly, no relay resetting is required. Additionally, an overvoltage protection device can be included that handles faults having high current and high voltage repeatedly with no cool down period, and no need for a bypass switch. Additionally, because the circuitry is passive, there is no requirement to include EMP shielding or filtering features that would be required on an automatic bypass switch, and no triggering required in the event of detection of potentially damaging direct current, harmonics or EMP-E1 pulse, thereby simplifying the overall circuit.

Further, in example embodiments, if a DC voltage at the transformer neutral reaches a threshold that is close to the withstand limit of a DC blocking component or insulation of transformer neutral, rather than switching an automatic switch to bypass the DC blocking component or allow the overvoltage device to trigger (which would allow DC current to flow), the system of the present disclosure system sends a signal to open the large AC Phase Breakers to safely de-energize the transformer to protect it from an inrush of high DC current.

FIG. 1 is a generalized embodiment of a passive transformer neutral blocking system 100, according to the present disclosure. The passive transformer neutral blocking system 100 generally is connected between a transformer neutral 10 of a transformer 12 and a ground 14. The passive transformer neutral blocking system 100 includes a DC blocking component 110 connected between a connection to the transformer neutral 10 and ground 14. As further explained in the examples below, the DC blocking component 110 can include one or more direct current blocking devices (e.g., capacitors or resistors) between ground 14 and the transformer neutral 10, to prevent damaging DC or quasi DC ground currents in the transformer neutral 10, which would in turn cause possible damage to the transformer 12. Depending on the specific application, either a capacitive or resistive (or some combination thereof) blocking device 110 could be employed. Various configurations of a DC blocking component are described, for example, in U.S. Pat. No. 8,878,396, the disclosure of which is hereby incorporated by reference in its entirety. However, and by way of comparison, in that patent the DC blocking component is selectively removable from the circuit between the transformer neutral 10 and ground via a switching configuration that is actuable to bypass the DC blocking component as part of the protective scheme of that system. In the present application, passive overvoltage devices may instead be used to discharge high DC voltage events that would otherwise have the possibility of damaging the system 100.

In accordance with the present disclosure, a passive overvoltage protection device (OVPD) 112 can be connected in parallel with DC blocking component 110 between the transformer neutral 10 and the ground 14 to protect the DC blocking component and the transformer. The passive OVPD 112 is able to maintain protection in the event of multiple overvoltage events within a short period of time. Passive OVPD 112, as described previously and as further explained in the examples below, can include any number of devices. The overvoltage protection devices, according to various example embodiments of the present disclosure, can include one or more of the following: a spark gap, a metal oxide varistor, a silicon carbon varistor, a variable resistor, a surge arrestor, or any other suitable component designed to form a path to ground and away from the protected components for signals over a threshold voltage. In example embodiments, passive OVPD 112 could include, for example, a particular type of spark gap constructed to non-destructively, repeatably discharge overvoltage events. Example spark gaps useable as the OVPD 112 are described in U.S. Pat. No. 9,660,441, entitled "Overvoltage Protection For Power Systems", the disclosure of which is hereby incorporated by reference in its entirety. An alternative version of such a device is described below in connection with FIGS. 8A-8D and FIG. 9.

The passive OVPD 112 provides protection for the passive transformer neutral blocking system 100 and the transformer 12, and is useful in the event of a fault or large DC or quasi DC voltages exceeding the capability of the DC blocking or limiting device, such as those potentially caused by large GMDs or HEMP-E3 events. In the case of large GMDs or HEMP-E3 events it may be preferred by some utilities to block DC up to the DC voltage withstand limit of the DC Blocking device and then trigger the large AC phase breakers to open thereby de-energizing the transformer before the passive OVPD triggers and DC current begins to flow.

Figure 2:
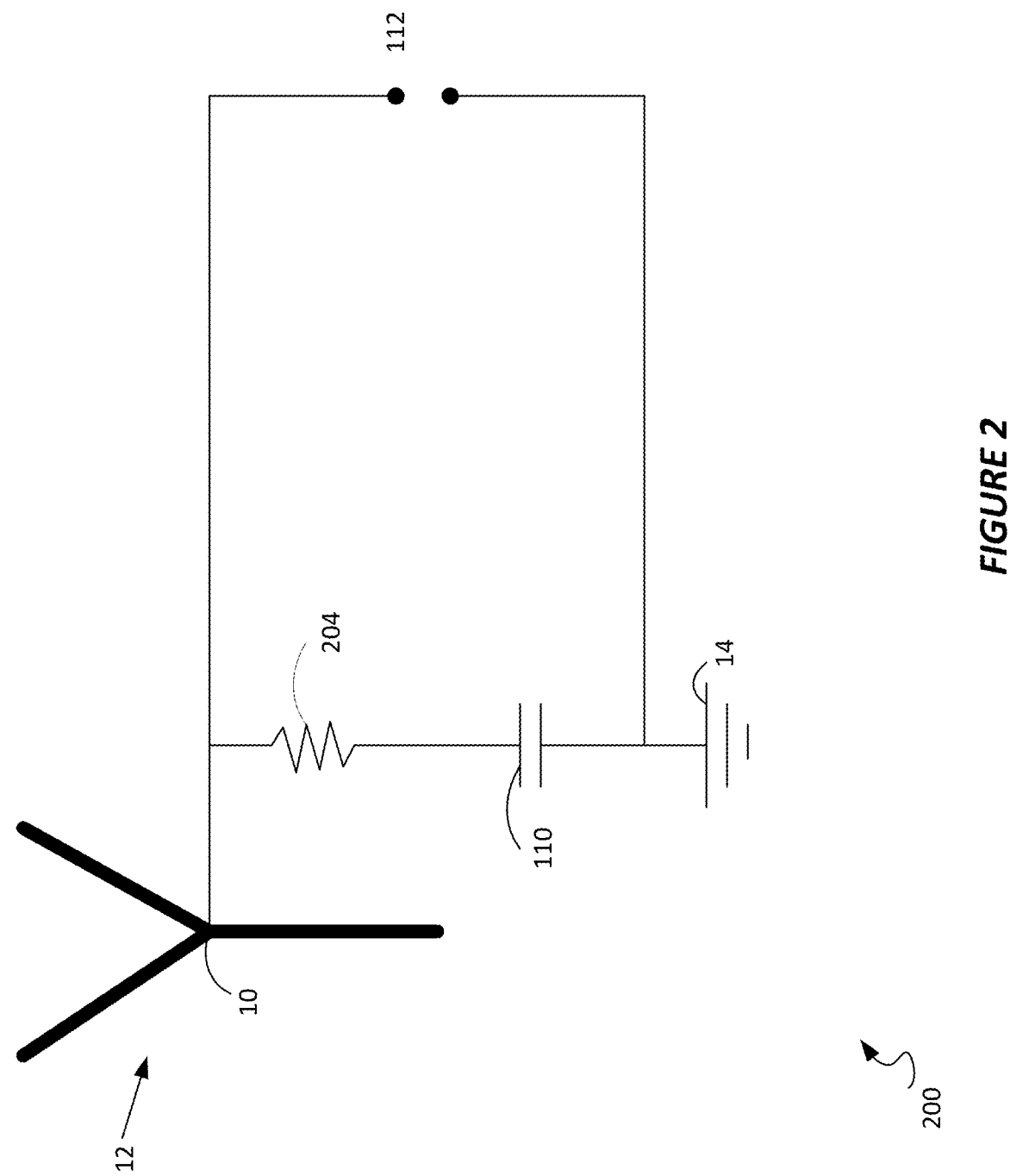
FIG. 2 is a perspective view of a passive transformer neutral blocking circuit, according to a second possible embodiment of the present disclosure.

Referring now to FIG. 2, a further embodiment of a passive transformer neutral blocking system 200 is shown. In this embodiment, the passive transformer neutral blocking system 200 includes a power resistor 204. Power resistor 204 adds enough resistance to dampen any ferroresonance, reduces the voltage across the capacitor bank during a fault or transient event and limits the discharge current from the capacitor bank. In example embodiments, the power resistor 204 can have a value typically between 0.3 and 5.0 Ohms.

Figure 3A:
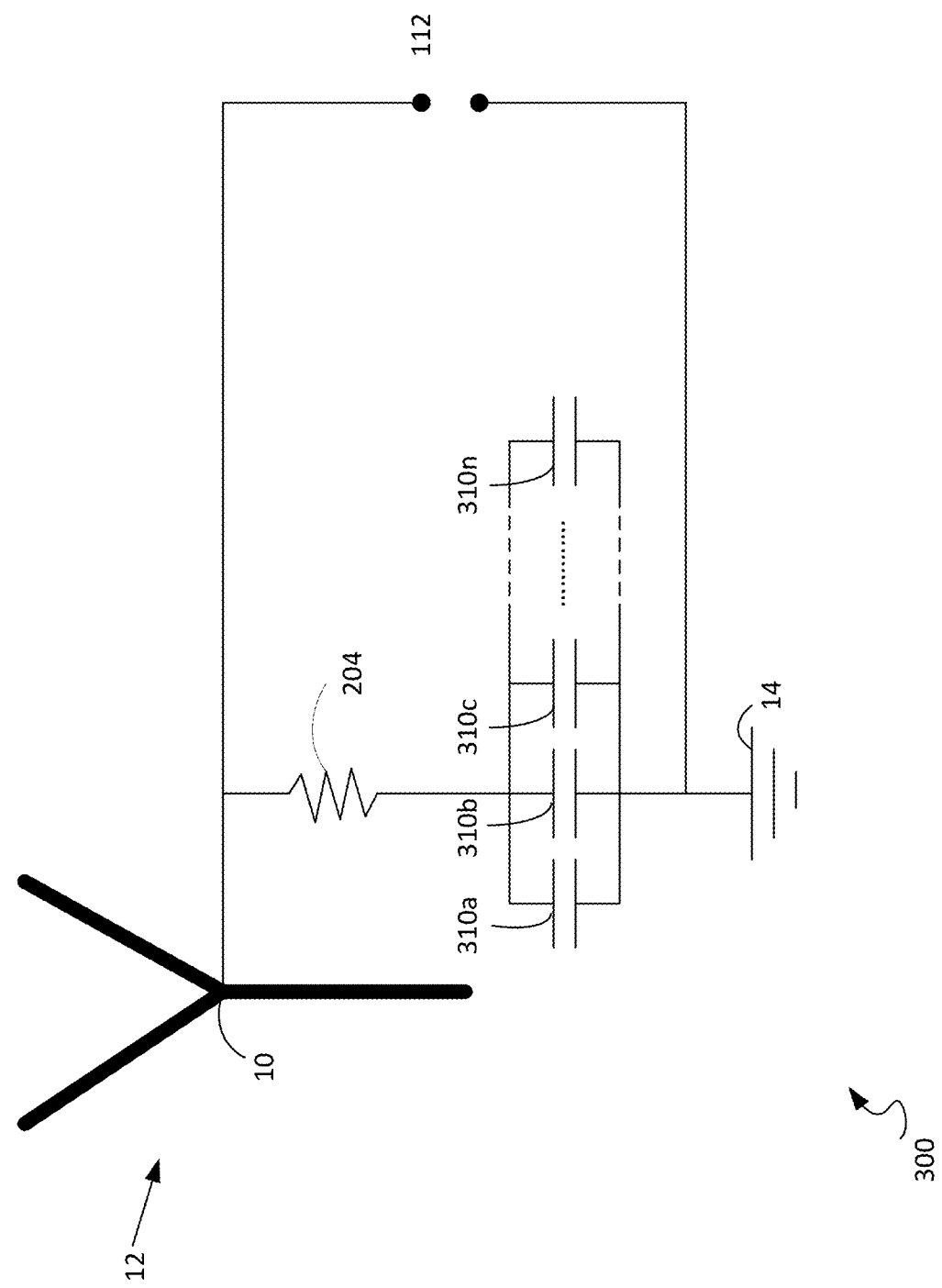
FIGS. 3A-3B are perspective views of a passive transformer neutral blocking circuit, according to a further possible embodiment of the present disclosure.
Figure 3B:
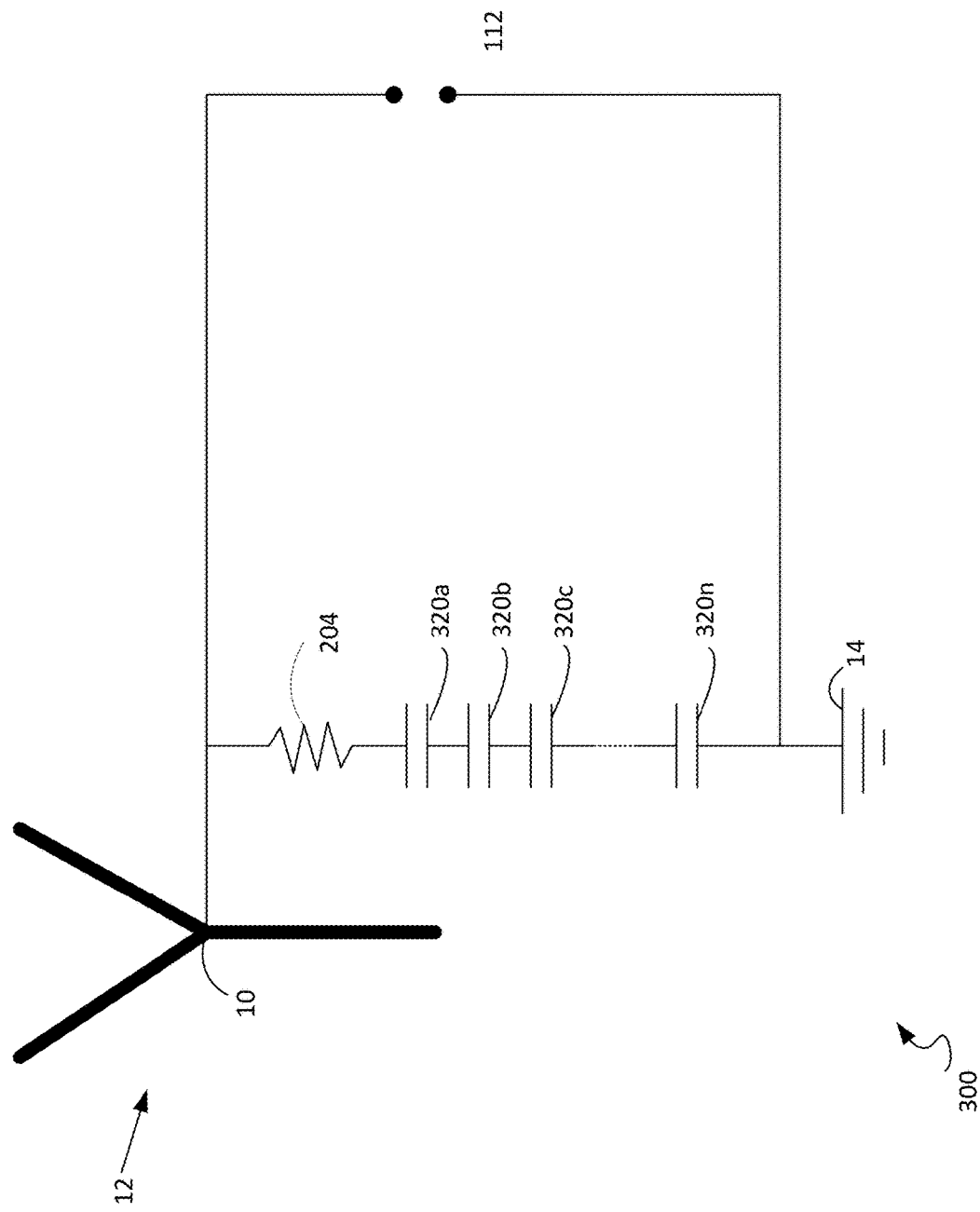

Referring now to FIG. 3A, a further embodiment of a passive transformer neutral blocking system 300 is shown. In this embodiment, the DC blocking component is comprised of a bank of capacitors 310a-n electrically connected in parallel, generally referred to as capacitor bank 310. Capacitor bank 310 lowers the impedance of the system, by adding additional capacitors. FIG. 3B illustrates a further embodiment with a capacitor bank 320a-n that increases the voltage standoff of the system by adding capacitors in series. Since relays may require resetting when high impedance capacitors are used, use of such a low impedance capacitor bank may be preferred. A low impedance capacitor bank is also important to maintain an effective ground per IEEE Standard, C62.91 definition for grounding. Power system relays (e.g., relays connected to phases of the power line) are networked, and operate in conjunction to clear ground faults based on signal levels carried on the power line phases.

Figure 4:
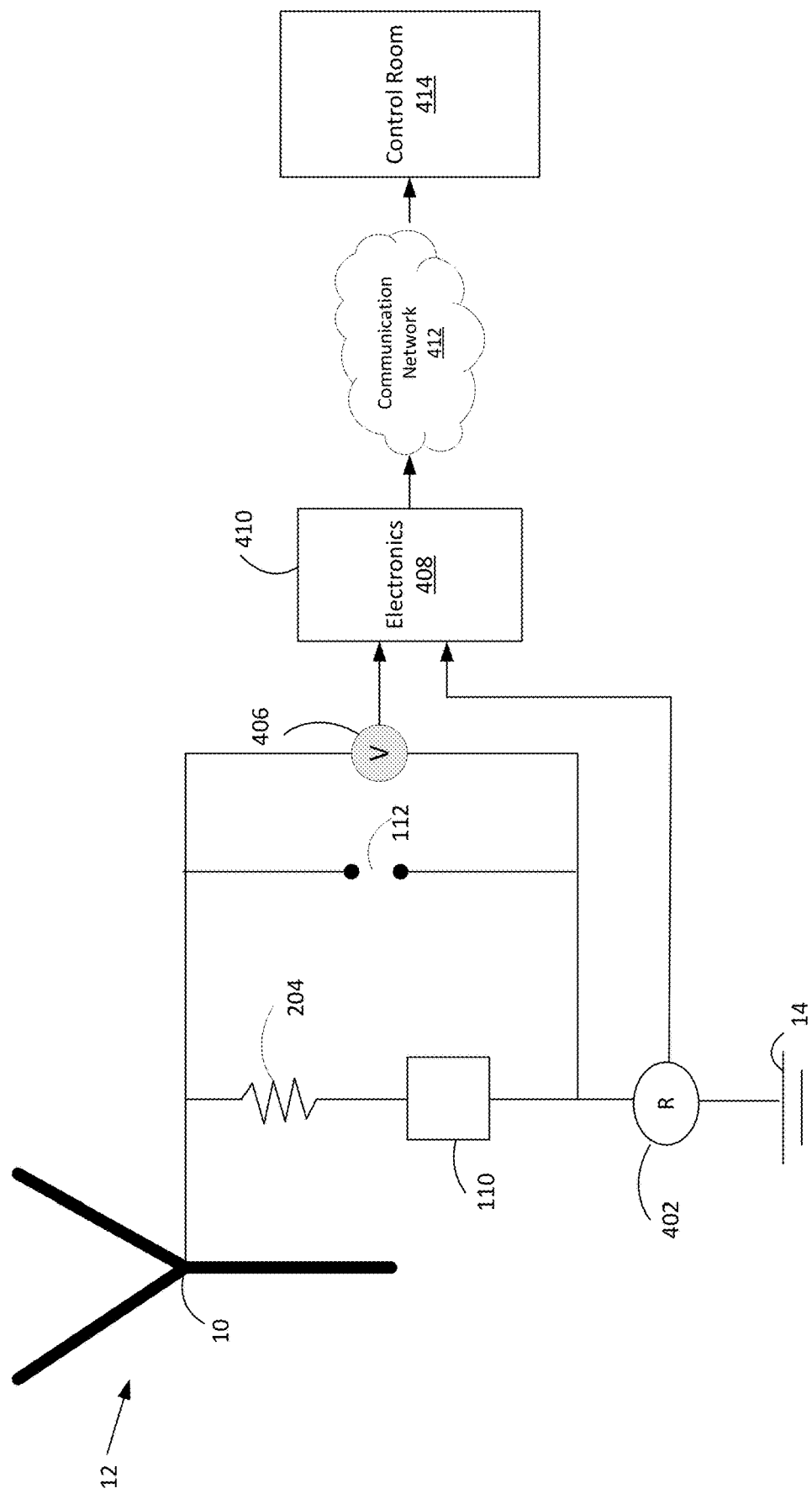
FIG. 4 is a perspective view of a passive transformer neutral blocking circuit, coupled with sensing and control electronics, according to a further possible embodiment of the present disclosure.

Referring now to FIG. 4, a further example embodiment of a passive transformer neutral blocking system 400 is shown. In this example embodiment, a neutral current monitoring device 402 is connected between the DC blocking component 110 and ground 14, as well as between passive OVPD 112 and ground. A neutral monitoring device 402 measures the AC current of the power system and, with electronics module 408, can be used to determine when maintenance on the power system is required. In some embodiments, neutral current monitoring device 402 can be a Rogowski coil or a current transformer.

FIG. 4 also illustrates electronics module 408, in accordance with a possible embodiment of the present disclosure. The electronics module 408 can monitor the overall performance of the neutral blocker and transformer and reports the results to the control room 414 over a communication network 412. The control room 414 may be local or remote from the electronics module 408. FIG. 4, in this example, includes a voltage measuring device 406 for reporting voltage between transformer neutral 10 and ground to electronics module 408.

In the embodiment shown, electronics module 408 is enclosed within a shielded enclosure 410 to prevent high frequency, high power electromagnetic signals from entering the enclosure, thereby exposing the sensitive electronics to potential interference and damage. The electronics module can include, for example, a control circuit, e.g., implemented as a microprocessor and/or communication circuitry, as well as signal conditioning circuitry useable to receive inputs from a neutral monitoring device 402 and/or a voltage measuring device 406, e.g., for generating notifications of various events observed at the transformer neutral 10 and within the system 400 or across a large section of the power grid generally.

In the embodiment shown, the shielded enclosure 410 is an EMP/IEMI Faraday shielded enclosure with conductive seals around all door openings to provide radiative protection from electromagnetic frequencies typically from about 14 kHz to 10 GHz.

Figure 5:
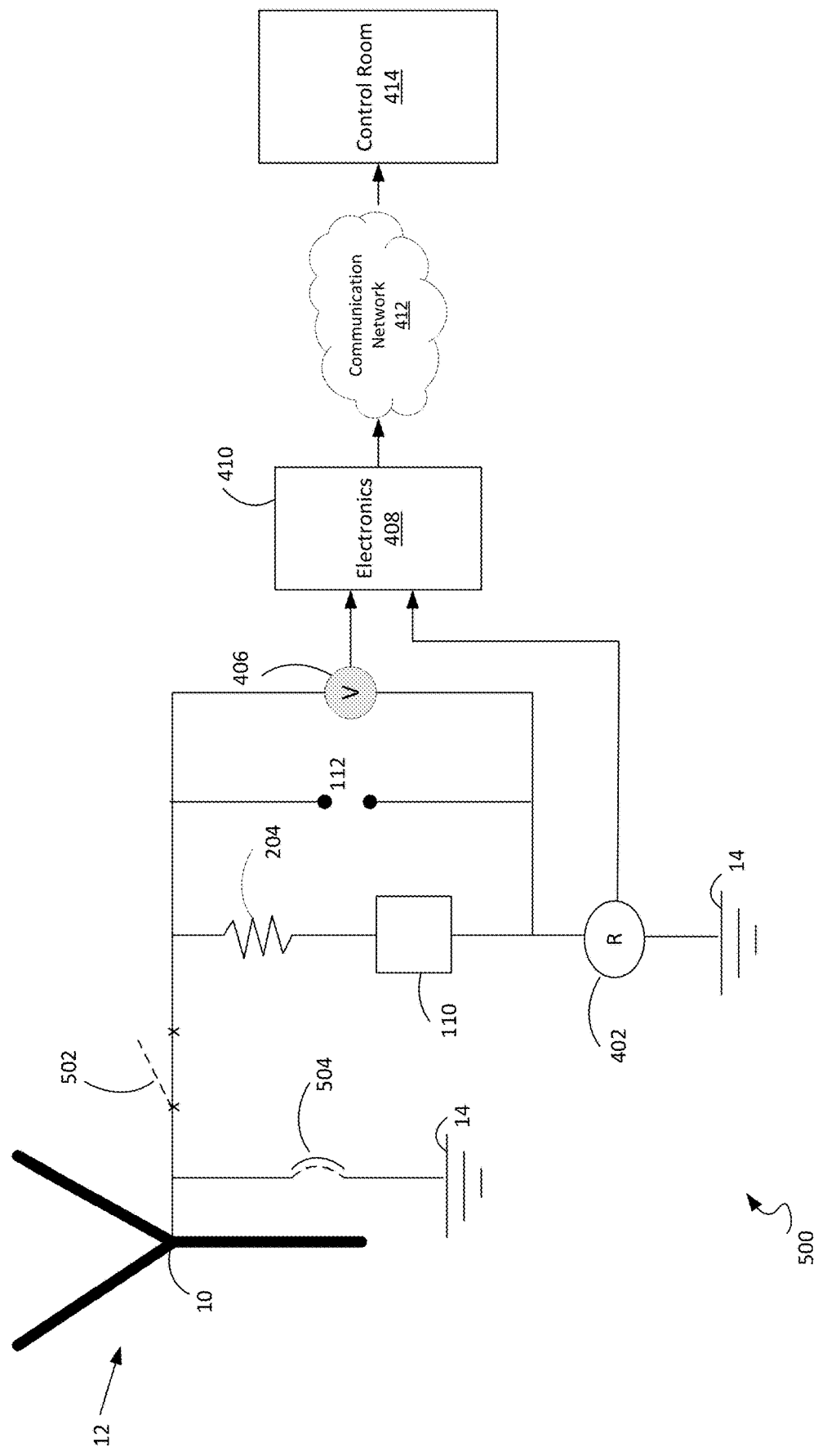
FIG. 5 is a perspective view of a passive transformer neutral blocking circuit having maintenance and AC breaker switches, according to a further possible embodiment of the present disclosure.

Referring now to FIG. 5, a further embodiment of a passive transformer neutral blocking system 500 is shown. In this example, both a maintenance bypass switch 502 and an AC circuit breaker 504 are shown. According to various embodiments of the present disclosure, the maintenance bypass switch 502 allows for safe maintenance of the passive transformer neutral blocking circuit, and the AC circuit breaker 504 allows for safe operation of the maintenance bypass switch 502 by preventing an arc across the maintenance switch 502. Maintenance switch 502 is normally closed and is connected between the transformer neutral 10 and the passive transformer neutral blocking circuit, while AC circuit breaker 504 is connected between the transformer neutral 10 and ground 14 and is normally open. Neutral current monitoring device 402 can also be used to measure neutral AC imbalances and determine when it is safe to operate the maintenance switch 502. As noted above, since the maintenance switch 502 is maintained in a closed state unless manually opened, the DC blocking component 110 is persistently maintained within the system 500.

Figure 6:
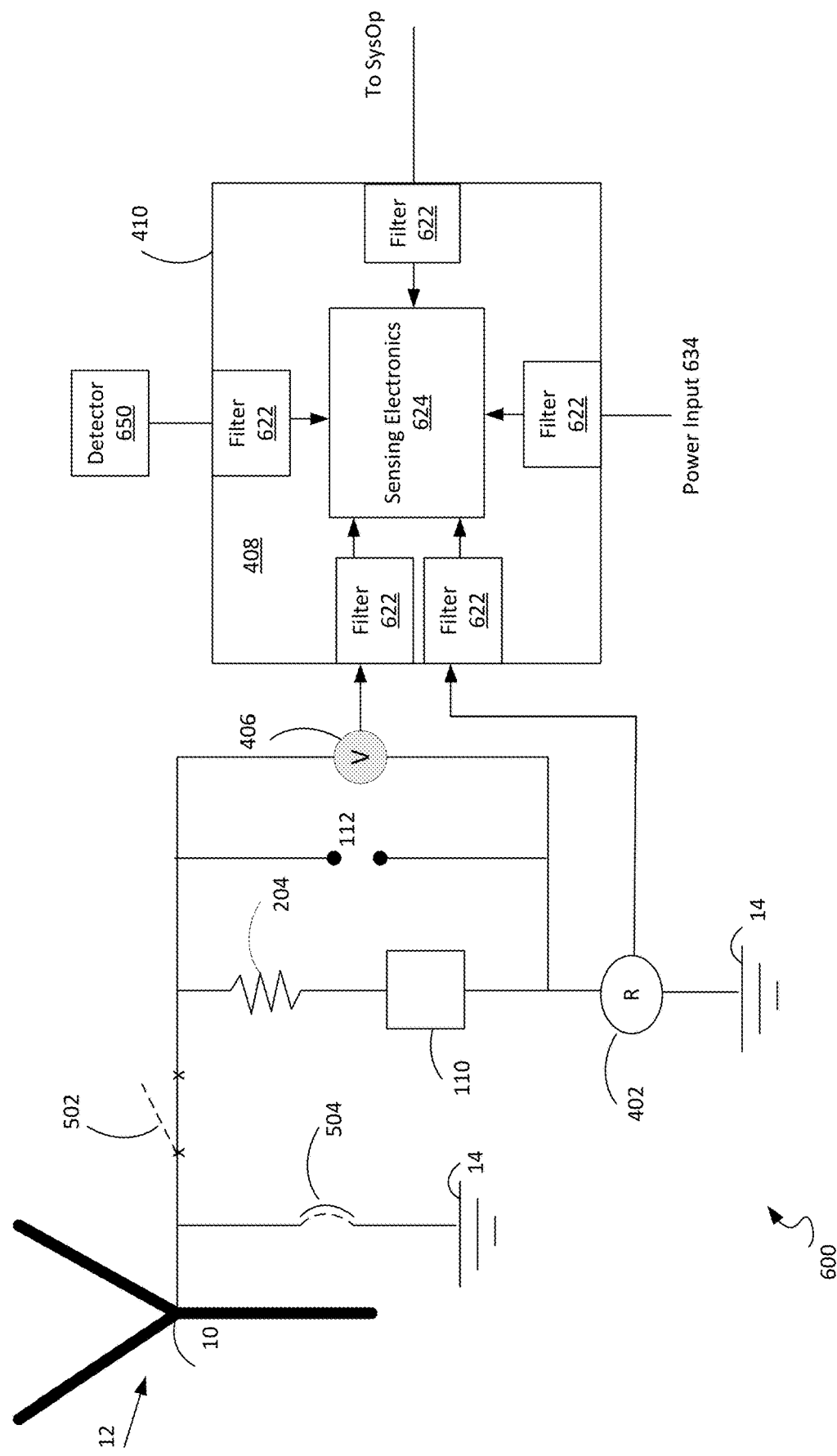
FIG. 6 is a perspective view of a passive transformer neutral blocking circuit, according to a further possible embodiment of the present disclosure.

Referring now to FIG. 6, a further embodiment of a passive transformer neutral blocking system 600 is shown. In this embodiment, electronics module 408 includes a plurality of filters 622 positioned at a periphery of the enclosure 410. The filters 622 can typically be a low pass or band pass filter with surge suppression to suppress signals that could negatively impact the performance of the electronics and signal processing components inside the enclosure. In such an embodiment, to ensure protection, filtering is present on all electrically conductive wires that penetrate the enclosure 410. Additionally, in the embodiment shown, a filter 622 is positioned on a power input 634, as well as the output to a system operator. A further filter 622 is electrically connected between sensing electronics 624 and one or more electromagnetic detector(s) 650. The electromagnetic detector 650 can be, for example, a shielded magnetic loop antenna-based detector configured to detect EMP/IEMI events. An example of such a detector is described in U.S. Pat. No. 8,773,107, the disclosure of which is hereby incorporated by reference in its entirety.

As illustrated in FIG. 6, the sensing electronics 624 can be used to detect signals from the neutral monitoring device 402 and/or the voltage measuring device 406, and report those signals to, e.g., a control room either locally or remotely located from the electronics 624. The sensing electronics 624 can include a programmable circuit, such as a microprocessor or programmable gate array type device, as well as a memory useable to store instructions for defining signal thresholds (current and/or voltage) at which messages may be generated. The sensing electronics 624 may also be configured to generate actuation signals to take certain actions in response to observed current and/or voltage events, such as described below.

Figure 7:
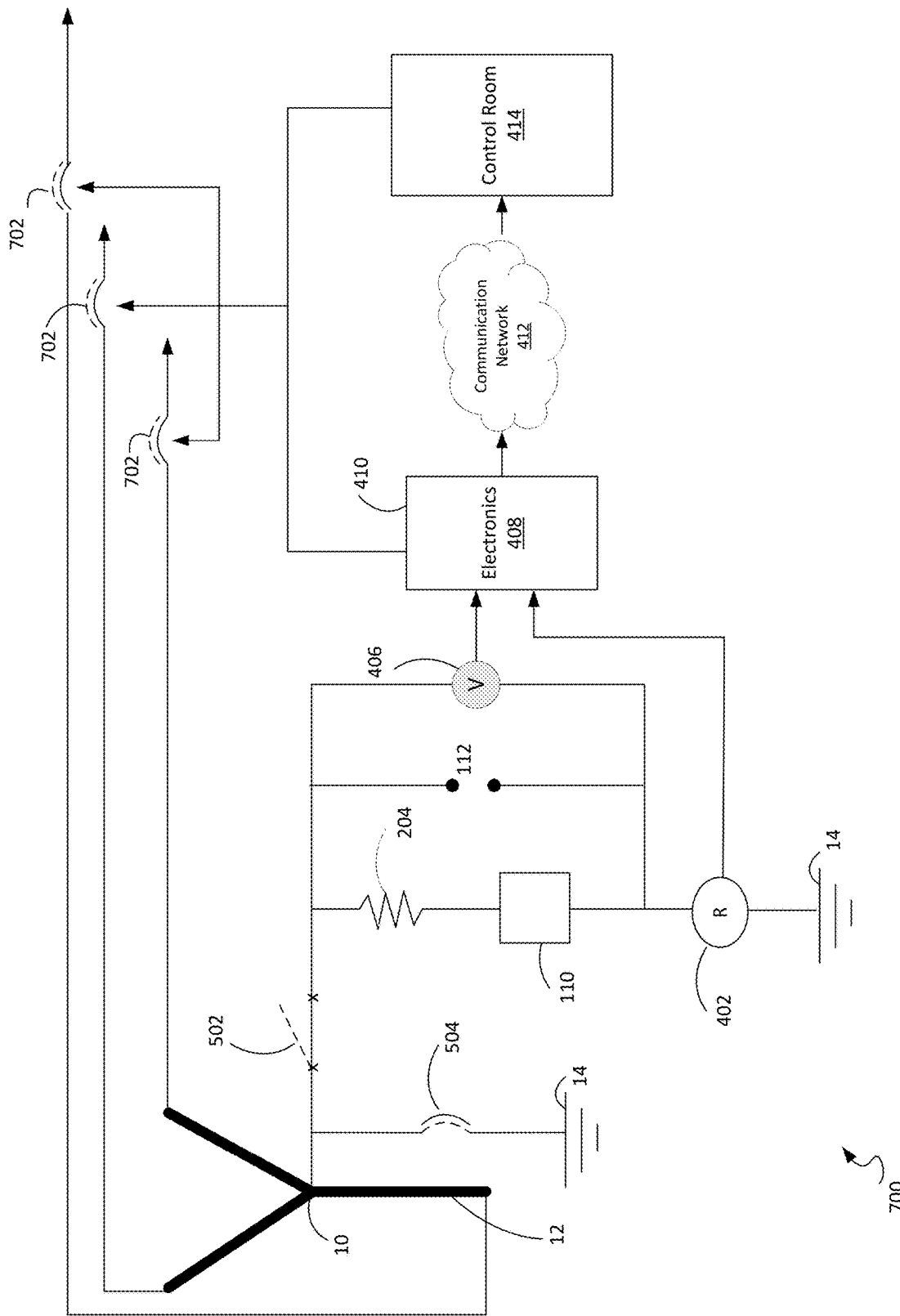
FIG. 7 is a perspective view of a passive transformer neutral blocking circuit sending a signal to the phase circuit breakers, according to a further possible embodiment of the present disclosure

Referring now to FIG. 7, a further embodiment of a transformer neutral blocking system 700 is shown. In this embodiment, high voltage breakers 702 are electrically connected to the power line phases of transformer 12. An example of such a neutral blocking system is described in U.S. patent application Ser. No. 15/887,781, the disclosure of which is hereby incorporated by reference in its entirety.

During operation of the transformer neutral blocking system 700, voltage measuring device 406 may report a DC voltage across transformer neutral 10 to ground 14 to electronics module 408, which may determine that the DC voltage is indicative of an event that is potentially damaging to the DC blocking component 110 (e.g., above a rated voltage of a particular capacitor or capacitor bank) or the transformer itself (e.g., being at a level at which damage to insulating materials within the transformer is possible). Still other types of damage within the overall system 700 may be detected as well by the electronics module 408, and may be based, for example, on an instantaneous DC voltage being above a predetermined threshold or a rate of change of DC voltage being above a predetermined threshold rate (as noted above). Electronics module 408 may then send a signal to open one or more of high voltage breakers 702 to prevent triggering of the passive OVPD 112 for DC voltages above the DC threshold, as further described below in reference to FIG. 10. In other words, the DC threshold in the embodiment illustrated in FIG. 7 may be set lower than a DC voltage which triggers the passive OVPD 112, thereby preventing DC current which may flow once passive OVPD 112 is triggered. In addition, high voltage breakers 702 may be controlled by the control room 414, e.g., via communication with the electronics 408 via the communication network 412.

In some embodiments, the system may also include an electromagnetic detector, such as electromagnetic detector(s) 650 shown in FIG. 6. In such arrangements, since the system is configured to be responsive to EMP/IEMI events, the high voltage breakers may be shielded to ensure proper operation and protection during such events.

Referring to FIG. 7 generally, it is noted that the transformer neutral blocking system described therein can have a number of advantages in operation. Specifically, actuation of the high voltage breakers 702 in the event of possible damaging DC currents means that the transformer remains protected, while the high voltage breakers 702 can be actuated by an actuation signal from the electronics module 408. As noted above, such events can include, for example, detection at the electronics module 408 that the voltage measuring device 406 (e.g., a voltage probe or other voltage measuring device) has sensed a voltage above a predetermined threshold, or above a predetermined threshold for a predetermined amount of time. Still further the electronics module 408 can trigger the high voltage breakers 702 with an actuation signal in response to a change of voltage exceeding an acceptable rate of change, e.g., due to a fast rise time of voltage. In example embodiments, a rate of voltage change of about 100 V/ms to about 175 V/ms may indicate a fast rise time that is distinguishable from typical AC current.

In addition, actuation of the high voltage breakers may have further advantages. For example, actuation of the circuit breakers 702 may result in disconnection of the transformer 12 from a power grid overall, or at least results in segmentation of the power grid. In instances where induced DC voltage on the transformer neutral or power line phases may occur (the magnitude of which is dictated on a volts/meter basis), shorter segments within a grid may result in a lower DC voltage, since the length over which voltage may be induced is shortened. Accordingly, this segmentation also protects against potential damage to the transformer 12 or to the DC blocking component 110.

In example embodiments where the electronics 408 is in communication with a control room 414 (and alternatively other electronics 408 located in association with other transformer neutral protection circuits associated with other power grid transformers), either the electronics 408 or control room 414 may transmit a signal via communication network 412 addressed to electronics associated with a different transformer. In this way, detection of a high DC voltage event (or a rate of change voltage event) occurring at one transformer may trigger immediate segmentation of the power grid in a way that would prevent damage elsewhere within the power grid as well, without relying on each protection circuit having to sense such an event. Still further, in example embodiments, the electronics 408 or control room 414 may execute an algorithm for selecting which protection systems from among a large number of protection systems within a power grid are to receive such actuation commands to open the high voltage breakers on phases of other power grid transformers. This may include, for example, identifying those transformers that may safely segment the power grid into segments having a length unlikely to induce significantly high voltage, while maintaining connection to a power source for as much of the power grid as possible. This segmentation may be based on a distance between transformers (and therefore a length of the segments created) or a distance between a power generation station and the transformer to be disconnected (e.g., to minimize the population experiencing loss of power due to actuation of breakers). In some instances, an algorithm is applied combining these factors with the voltage experienced to select the specific transformer protection circuits to which breaker actuation signals should be transmitted.

Accordingly, and with respect to FIG. 7 specifically, it is noted that the actuation of high voltage breakers 702 may be advantageous in combination with the passive neutral blocking devices of the present disclosure, as well as with other types of passive and active neutral blocking devices described in the patents and publications incorporated by reference herein. For example, the actuation of high voltage breakers 702 may be performed in response to detection of a particular DC voltage while maintaining a DC blocking component within the system, as described with respect to the passive mode systems described herein. However, that actuation may be performed in combination with (or independently of but within the same circuit as) actuation of a switch that selectively bypasses or selectively introduces the DC blocking component between the transformer neutral and ground, such as is shown in U.S. Pat. No. 8,878,396.

Figure 10:
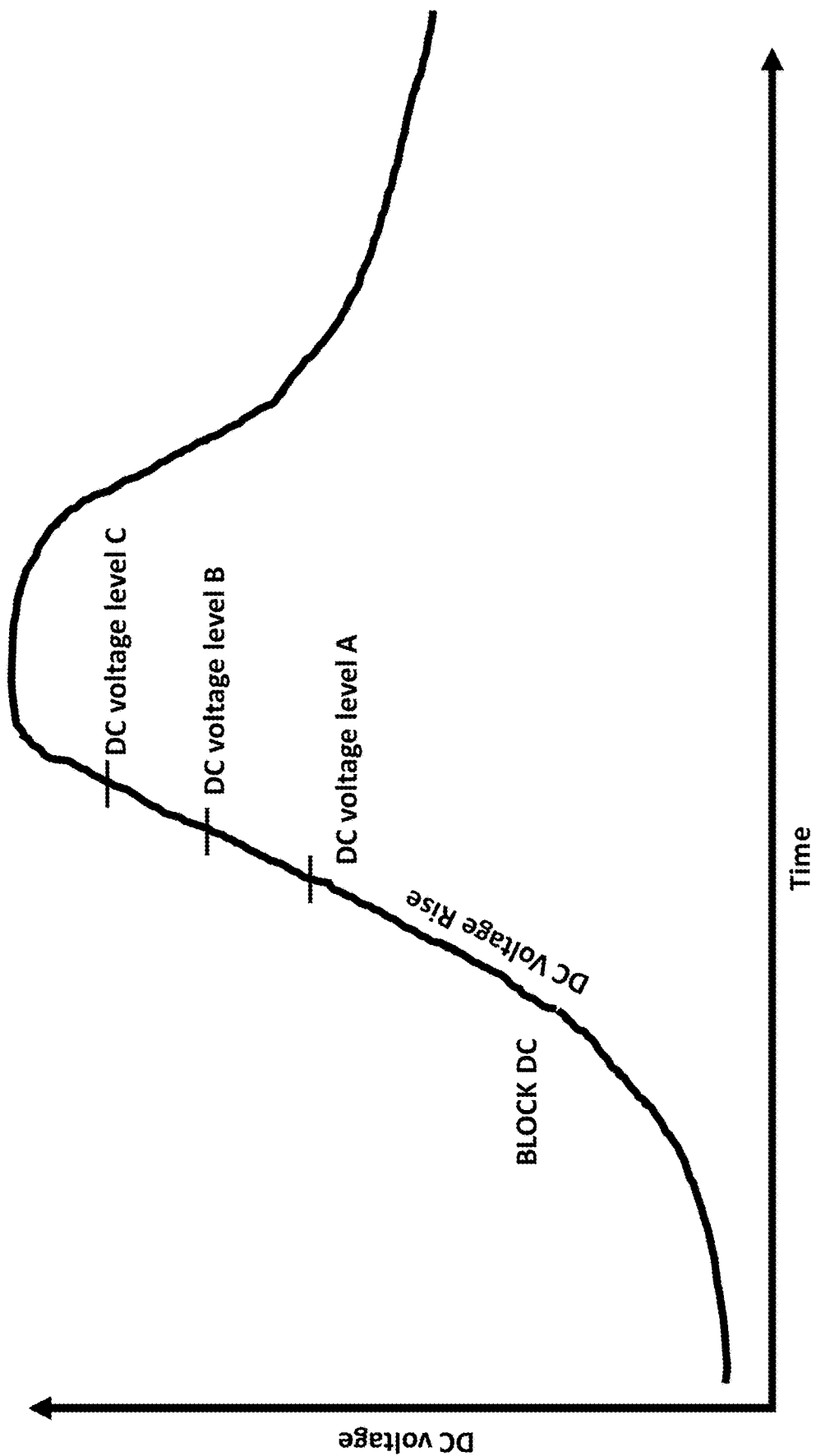
FIG. 10 is a plot of the DC voltage on a transformer neutral when high DC or quasi-DC currents are being blocked.

Referring now to FIG. 10, a plot 1000 of the DC voltage observed at a transformer neutral is shown as a function of time, with various thresholds illustrated for purposes of explanation of operation of the systems described herein. It is noted that, in conjunction with this figure, and with the disclosure overall, the term DC voltage or DC current refers to both DC voltage and quasi-DC voltage, or DC current and quasi-DC current, respectively.

In the plot 1000 shown, a DC voltage experienced at a transformer neutral (e.g., as detected by a voltage measuring device 406) In the example shown, DC neutral blocking component 110 may have a DC voltage withstand limit corresponding with DC voltage level C, such that DC voltages above this limit may begin to breakdown or damage DC neutral blocking component 110 and leave the transformer at risk of damage, or may additionally/alternatively may begin to damage the insulation within the transformer 12 itself. These thresholds generally are referred to as the voltage withstand or voltage withstand limit of the DC neutral blocking component and/or the transformer insulation, respectively. Example ranges of voltage are noted below.

Additionally, passive OVPD 112 may be set to trigger at voltage level B, which is lower than DC voltage level C, and which may protect both the DC neutral blocking component 110 and the transformer 12 from damage in the event of an overvoltage event (e.g. a fault). DC voltage limit B may typically be slightly lower than a rated voltage of the DC neutral blocking component 110 or the transformer 12, and can be within the ranges noted below.

It is noted that triggering passive OVPD 112 at voltage level B will result in undesirable DC current flowing to ground. Therefore, when using the various circuit variants described above in connection with FIG. 7, the electronics module 408 may be configured to transmit an activation signal to open one or more of the high voltage breakers 702 at DC voltage level A. DC voltage level A is generally set to be lower than voltage level B, to prevent passive OVPD 112 from triggering on a DC voltage and thereby safely de energize the transformer before the possible inrush of high DC currents.

In some embodiments, transformer 12 may have a 35 kV DC voltage limit, above which the risk of degradation of transformer neutral insulation is deemed to be unacceptable. In some embodiments, the DC blocking component 110 DC voltage withstand limit is in the range of 16-34 kV DC, corresponding to DC voltage level C. Accordingly, the passive OVPD 112 may have a DC trigger voltage configured to be within a range of about 8-15 kV, corresponding to voltage level B. Electronics module 408 may be configured to open one or more high voltage breakers 702 at a DC voltage level within a range of about 7-14 kV DC, corresponding to DC voltage level A. In still other embodiments, the voltage limit of transformer 12, the withstand limit of DC blocking component 110, the trigger voltage of passive OVPD 112, and the voltage level at which electronics module opens one or more high voltage breakers may differ from those stated above; however, the relative ordering of operations will generally be selected to protect against damage to DC neutral blocking component 110 or the transformer 12.

Figure 8A:
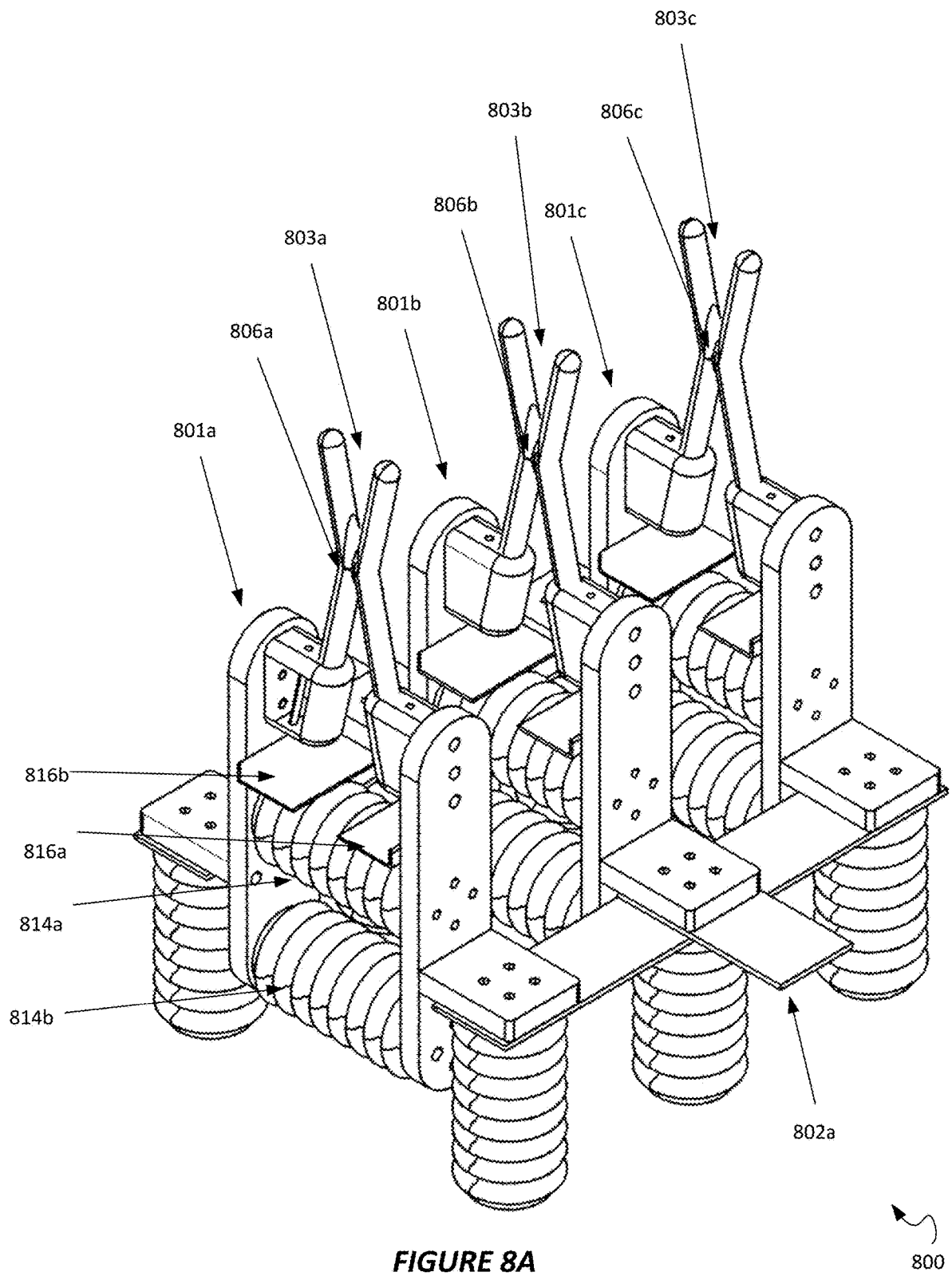

Referring now to FIGS. 8A-8D, an example of a passive OVPD is provided which can be used in conjunction with the passive protection circuits described above. FIG. 8A is a perspective view of a passive OVPD assembly 800 according to an example embodiment. The passive OVPD assembly 800 includes a plurality of subassemblies 801a-c and circuit leads 802a-b (802b is shown in FIG. 8D). The subassemblies are connected in parallel to the circuit leads 802a-b. Additionally, each of the subassemblies 801a-c includes a spark gap 806a-c. Although there are three subassemblies shown in this figure, other embodiments include more or fewer subassemblies. The subassemblies 801a-c include conductors 803a-c (e.g., generally formed as a Jacob's ladder) and a spark gap 806a-c at a narrowed area of the electrodes 810a-c.

In some embodiments, the widths of the spark gaps 806a-c are substantially the same. When a large ground fault current triggers the breakdown voltage of one of the spark gaps 806a-c, a portion of the corresponding electrodes surrounding the spark gap ablates and the width of the spark gap may change. This change in spark gap width may be an increase, which will cause a corresponding increase in breakdown voltage of that particular spark gap. In some cases, the breakdown voltage of the spark gap after ablation caused by a large ground fault current will be greater than the breakdown voltage of one of the other spark gaps. Accordingly, during the next large ground fault current, the arc will initiate in a different spark gap. In this manner, the assembly 800 will have an increased lifespan and will withstand multiple large ground fault currents.

In further embodiments, and in addition to the above feature of maintained breakdown voltage due to parallel devices, the spark gap width of one of spark gaps 806a-c may be generally maintained after a large ground fault current triggers, by being substantially ablation-resilient and constructed in such a manner that the Lorentz force pushes the destructive arc away from the spark gap region towards the ends of the electrodes and thus preserving the spark gap region. In such an arrangement, the breakdown voltage may not result in a substantial change in gap width, and a resulting increase in breakdown voltage of that particular spark gap over multiple hits. In general, it is required that the spark gap breakdown voltage remains in some predetermined range over a specified number of events.

In some embodiments, passive OVPD assembly 800 may be exposed to overvoltage events corresponding to a breakdown voltage above 5-8 kV, and below 28 kV, and having a current above 8,000 amps over at least 60 milliseconds. In other examples, the overvoltage events can correspond to a breakdown voltage above 5-8 kV and below about 35 kV with a current above about 5,000 amps over at least 40 milliseconds. Still other thresholds could be set as well; example thresholds are described in U.S. Pat. No. 9,660,441, which was previously incorporated by reference.

Figure 8B:
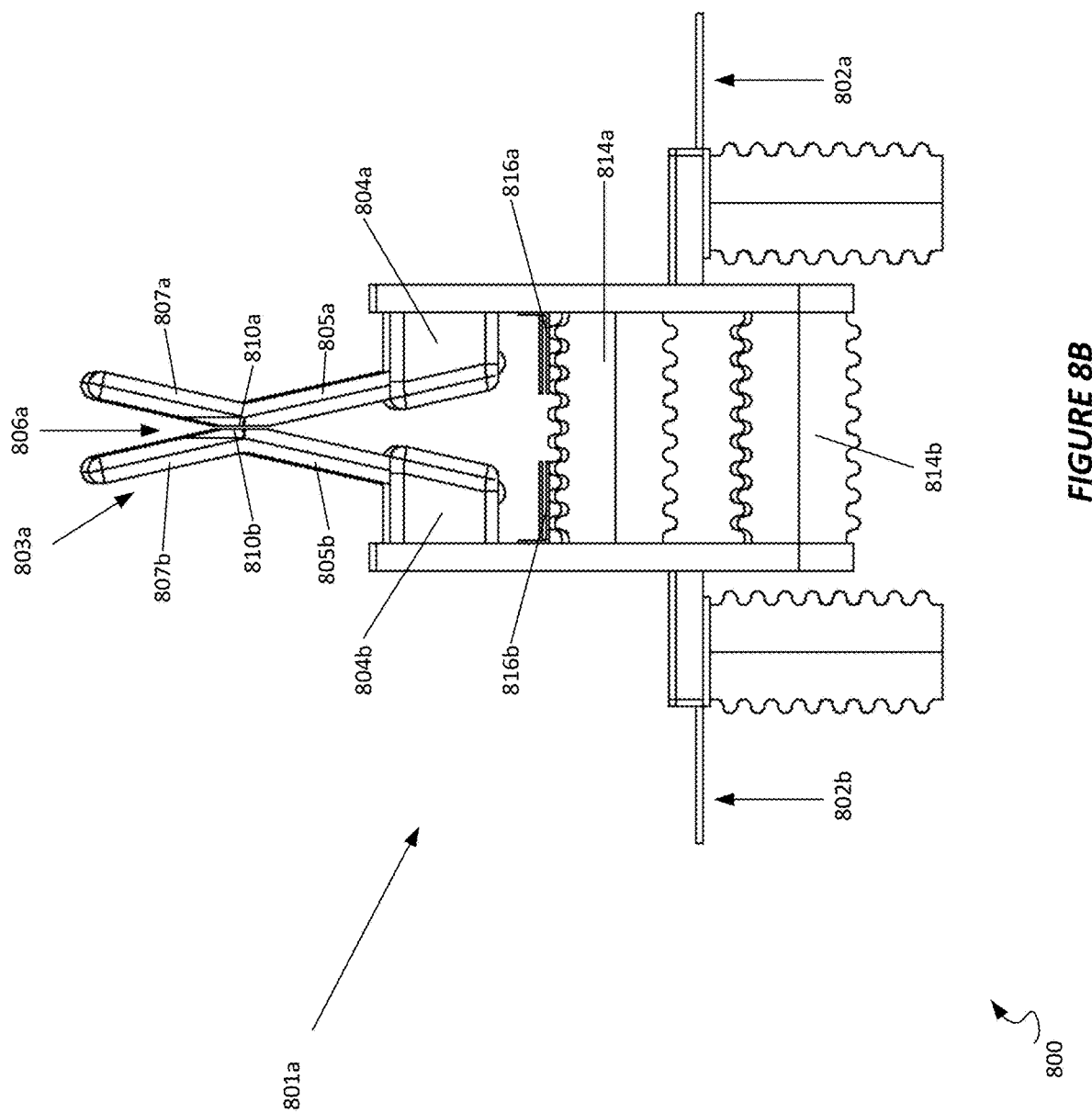

FIG. 8B is a front view of the subassembly 801a of passive OVPD assembly 800. The subassembly 801a includes mounts 804a-b, which support conductors 803a-c of which, only conductor 803a is shown due to perspective). Each of the conductors 803a-c is formed from a lower conductor and an upper conductor, shown as lower conductors 805a-b and upper conductors 807a-b, respectively. In addition, electrodes 810a-b are formed at the union of the lower and upper conductors. The support structure for the passive OVPD assembly 800 includes insulators 814a-b, and cylindrical shields 816a-b, in combination with mounts 804a-b.

The mounts 804a-b are, as shown, rigid support structures that are configured to secure and support the conductors 805a-b at a desired angle. In some embodiments, the mounts are configured to position the conductors 805a-b at an angle of 2.5-20 degrees from vertical. In alternative embodiments, the angle of the conductors may vary; for example, angles between about 2-90 degrees may be used. Generally, the angle encourages any discharge arc current forming across the electrodes 810a-b toward the upper conductors 807a-b due at least in part to a significant Lorentz force that occurs in the event of arc current in the voltage and current ranges outlined above. The mounts 804a-b are configured to withstand the Lorentz force generated between the conductors 805a-b when an arc current is formed.

Generally, the lower conductors 805a-b (also referred to herein as circuit leads) and upper conductors 807a-b (also referred to herein as extensions) are large-diameter, cylindrical rods that join to form the conductors 803a-c; at the union of the lower conductors and upper conductors are formed electrodes 810a-b. The diameter of the conductors 805a-b and 807a-b is selected based on the expected arc current for a given application of the overvoltage protection assembly 800. The conductors 805a-b are angled towards each other, such that the electrodes 810a-b are adjacent to one another. In some embodiments, the subtended angle between the conductors 805a-b is 5-40 degrees. The electrodes 810a-b are separated by the spark gap 806a.

In some embodiments, the lower conductors 805a-b, the upper conductors 807a-b, and the electrodes 810a-b are formed integrally from a rigid, conducting material with a high melting point. For example, in some embodiments, the conductors 805a-b, 807a-b, and the electrodes 810a-b are formed from a copper/tungsten alloy. In other embodiments, the conductors 805a-b, 807a-b, and the electrodes 810a-b are formed from different materials such as tungsten, copper, and niobium.

Additionally, the spacing between the electrodes 810a-b is further secured by the insulators 814a-b. The insulators 814a-b are rigid and formed from an insulating material. In some embodiments, the insulators 814a-b have a cylindrical shape. The insulators 814a-b are configured to secure the spacing between the mounts 804a-b, the conductors 805a-b, and the electrodes 810a-b, and accordingly, the width of the spark gap 806 as well. In example embodiments, one or more of the insulators 814a-b is positioned in an orientation in a direction of formation of an arc current across the electrodes 810a-b, thereby providing additional strengthening in that direction to avoid damage to the passive OVPD assembly 800 in the event of arc current formation due to Lorentz force in the direction of the arc current.

In some embodiments, shields 816a-b are included. The shields are, in the example shown, metal tabs that are disposed between the insulators 814a-b and supports 804a-b and are configured to interfere with the formation of a conductive path (from deposited carbon or materials expelled during an arc) along the surface of the insulators 814a-b. In alternative embodiments, shields 816a-b could be shaped differently, e.g., cylindrical and surrounding insulators 814a-b.

Figure 8C:
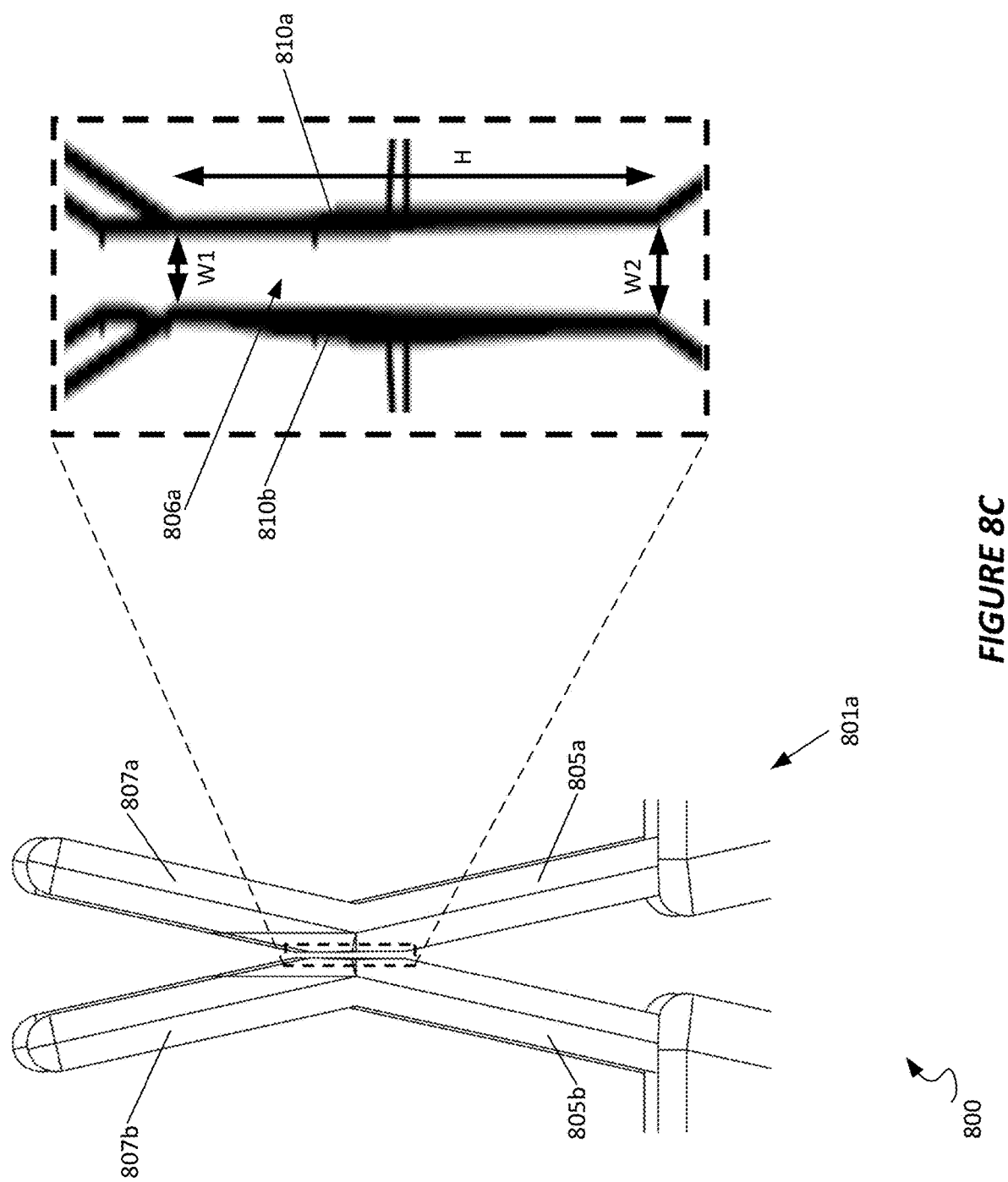

FIG. 8C is an enlarged front view of passive OVPD assembly 800. Subassembly 801a includes conductors 805a-b and 807a-b, electrodes 810a-b, and spark gap 810a-b are separated by a smaller distance than the bottoms of the electrodes 810a-b. For example, in some embodiments the tops of the electrodes 810a-b are separated by a first width W1 and the bottoms of the electrodes 810a-b are separated by a slightly larger second width W2. In some embodiments, the width W1 is 0.65 millimeters and the width W2 is 0.82 millimeters. In other embodiments, the width W1 is between 0.5 millimeters and 1 millimeter and the width W2 is between 0.75 millimeters and 1.25 millimeters. In still other embodiments, the width W1 is between 0.25 millimeters and 10 millimeters, and the width W2 is between 0.4 millimeters and 20 millimeters. In some embodiments, the difference between the first and second widths is around 0.4 millimeters. In other embodiments, the difference between the first and second widths is between 0.15 millimeters and 15 millimeters. In some embodiments, the flat surfaces of the electrodes 810a-b have a height H. In some embodiments, the height H is 1 inch. In other embodiments, the height H is between 0.5 inches and 4 inches. However, other embodiments with other heights and other first and second widths are possible as well. In some embodiments, the height H is between 5 millimeters and 15 millimeters. However, other embodiments with other heights and other first and second widths are possible as well. For example, widths W1 and W2 could be the same, rendering the spark gap to have parallel surfaces. Although this is sub-optimal because it provides less control over the location at which a spark would occur, it is operational. During an initial high ground fault voltage, the arc current will form at the top of the electrodes 810a-b. As material is ablated during high ground fault current events, the arc will start at lower positions in the spark gap 806. Nevertheless, ablation at the spark gap is minimized by the geometry of the passive OVPD assembly 800, and in particular conductors 803a-b, to ensure that ablation occurs at the ends of conductors 807a-b (at the ends of the extensions).

It is noted that the assembly 800 is constructed to withstand a breakdown voltage below 35 kV (but typically above about 5-8 kV) and a current above 5,000 amps over at least 40 milliseconds. However, in alternative embodiments, the assembly 800 can be constructed to withstand greater or lower breakdown voltages and/or currents, or to withstand such power dissipation over other time periods.

In addition, it is noted that the specific distance between electrodes 810a-b may be adjusted by adjusting a position of each of the conductors 803a-b within the mounts 804a-b, respectively. For example, due to angling of the lower conductors 805a-b, by mounting the conductors 803a-b to extend further from the mounts, the electrodes 810a-b may have less distance therebetween, while mounting the conductors 803a-b to extend a shorter distance from the mounts will cause the electrodes to be spaced further apart. Accordingly, an exact breakdown voltage may be selected based on distance between the electrodes.

Figure 9:
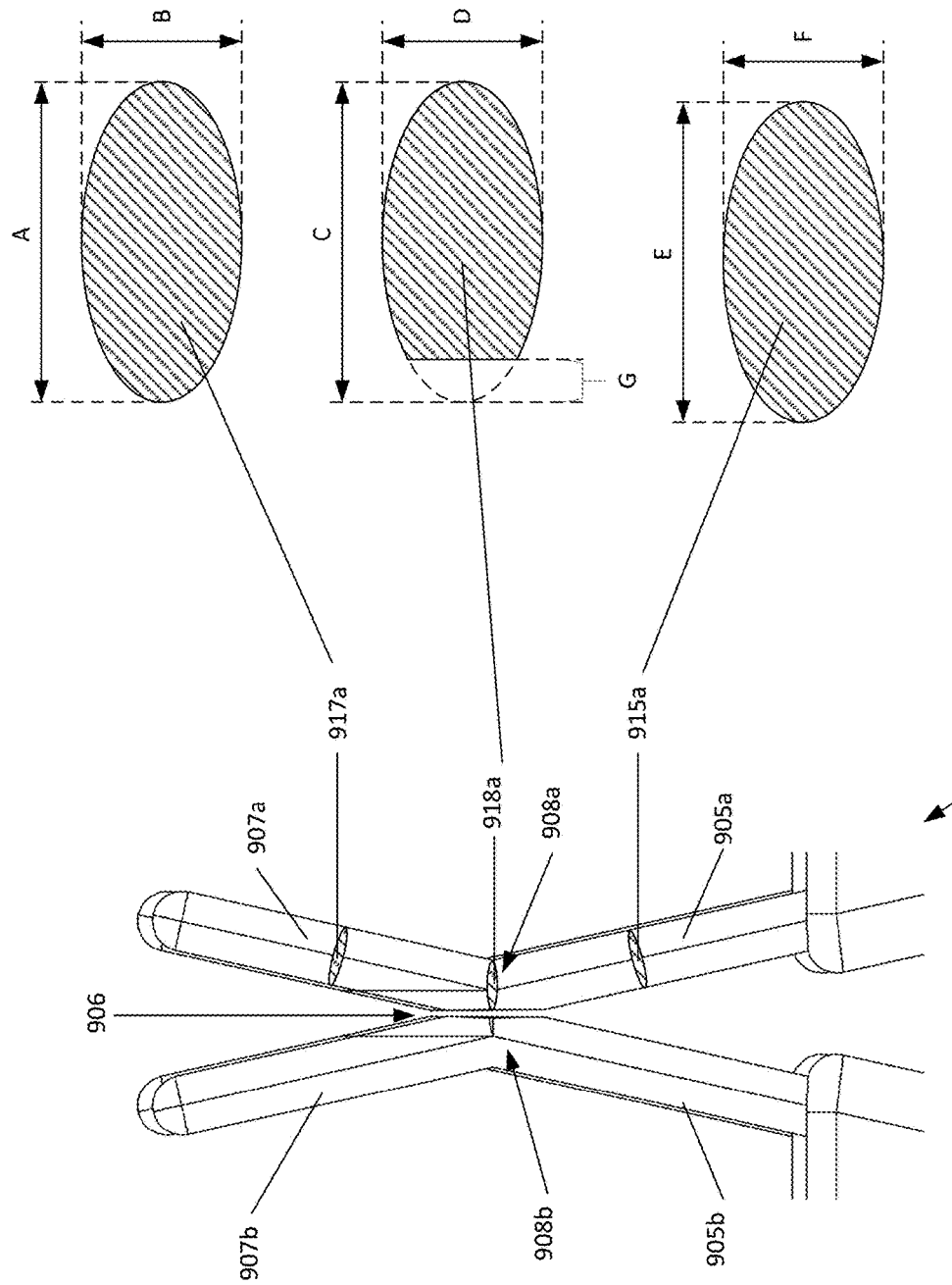
FIG. 9 is a front view of an example embodiment of a passive overvoltage protection device assembly.

FIG. 9 is a front view of a particular example embodiment of a passive OVPD assembly 900. Subassembly 901a includes conductor 905a with cross-sectional area 915a, conductor 907a with cross-sectional area 917a, spark gap 906, and cross-sectional area 918a formed by the union 908a of conductors 905a and 907a in the area of spark gap 906. Specifically, a flattened surface may be formed in the area of the spark gap, in some embodiments (e.g., as part of the electrodes 810a-b described above), and may be specifically flattened within the trapezoidal electrode regions shown in FIG. 8C, above. In some embodiments, conductors 905a and 907b may be generally cylindrical with circular or elliptical cross-sectional areas 915a and 917a. In other embodiments, conductors 905a and 907a may have other geometric shapes with other geometric cross-sectional area shapes. In some embodiments, conductor 905b has substantially the same shape and cross-sectional area as 905a, conductor 907b has substantially the same shape and cross-sectional area as 907a, and union 908b has substantially the same shape and cross-sectional area 918b as union 908a and cross-sectional area 918a.

FIG. 9 also illustrates lengths A and B of cross-sectional area 917a, lengths C, D, and G of cross-sectional area 918a, and lengths E and F of cross-sectional area 915a. In some embodiments, lengths A, B, E, and F are all 1 inch. In other embodiments, lengths A, B, E, and F are between 0.5 inches and 5 inches. However, other embodiments with other lengths A, B, E, and F are possible as well. In some embodiments, lengths C and D are 1 inch and length G is 0.2 inches. In other embodiments, lengths C and D are 2 inches and length G is 0 inches. In still other embodiments, lengths C and D are between 0.5 inches and 5 inches and length G is between 0 inches and 3 inches. However, other embodiments with other lengths C, D, and G are possible as well.

Overall, it is recognized that various embodiments of the present disclosure provide a number of advantages with respect to circuit protection, particular with respect to either harmonic signals or DC current signals at a grounding connection of AC electrical equipment, such as a transformer used for power generation or distribution. For example, blocking the DC or quasi DC neutral current prevents half cycle saturation in the transformer core which in turn prevents transformer over-heating, damage or failure. Additionally the DC blocking also improves the power quality by reducing harmonics which can activate power system relays and cause major instabilities as well as power outages. This largely prevents the tripping of utility power system relays, the disconnection of power compensation and other critical components, and in turn avoids the partial or total collapse of a power grid in the event of GIC or EMP events. Still further advantages include selective, coordinated protection of the power grid overall, or portions thereof.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A protection circuit useable in an alternating current system including a transformer, the circuit comprising:
   a direct current (DC) blocking component electrically connected between a neutral of the transformer and a ground; and
   an overvoltage protection device electrically connected in parallel with the DC blocking component, the overvoltage protection device being constructed to repeatably and reliably provide overvoltage protection in response to a voltage at the transformer neutral above a threshold;
   wherein the DC blocking component has an impedance below a predetermined value, thereby effectively grounding the neutral of the transformer; and
   wherein the DC blocking component is persistently maintained in connection to the transformer neutral during operation of the protection circuit.

2. The protection circuit of claim 1, wherein the DC blocking component and the overvoltage protection device are maintained in connection between the transformer neutral and the ground during operation of the protection circuit.

3. The protection circuit of claim 1, wherein the protection circuit lacks an automatic switching component capable of automatically disconnecting the DC blocking component and the overvoltage protection device from the transformer neutral.

4. The protection circuit of claim 1, further comprising a power resistor electrically connected in series with the transformer neutral and the DC blocking component.

5. The protection circuit of claim 1, wherein the DC blocking component comprises a capacitor.

6. The protection circuit of claim 1, wherein the overvoltage protection device includes at least one device selected from the group consisting of:
   a spark gap;
   a metal oxide varistor;
   a silicon carbon varistor;
   a variable resistor; and
   a surge arrestor.

7. The protection circuit of claim 1, wherein the overvoltage protection device is constructed to operate in response to the voltage at the transformer neutral above a threshold multiple times while maintaining operability within a predetermined range that remains below a voltage withstand of at least one of the transformer and the DC blocking component.

8. The protection circuit of claim 1, wherein the overvoltage protection device comprises a spark gap.

9. The protection circuit of claim 1, wherein the overvoltage protection device comprises:
   a first conductor and an opposed second conductor, each of the first conductor and opposing second conductor including a circuit lead, an electrode region, and an extension leading to an ablating end;
   a spark gap formed between the electrode region of the first conductor and the electrode region of the second conductor, the circuit electrically connected to the overvoltage protection device and exposed to a possible electrical event having a breakdown voltage below 35,000 volts and a current range of above 5,000 amps over at least 40 milliseconds;
   wherein the spark gap is designed such that, in the event of an electrical event within a range of the possible electrical events, a breakdown voltage at the spark gap is maintained within a predetermined range, thereby allowing repeated use of the spark gap in connection with electrical events corresponding to the possible electrical event.

10. The protection circuit of claim 1, wherein the overvoltage protection device comprises:
    a first electrical connection;
    a second electrical connection;
    an electrical discharge device including a first conductive bus connected to the first electrical connection and a second conductive bus connected to the second electrical connection, wherein the electrical discharge device has a first breakdown voltage and wherein when a voltage differential between the first conductive bus and the second conductive bus exceeds the first breakdown voltage, a first electrical current passes between the first conductive bus and the second conductive bus.

11. The protection circuit of claim 1, further comprising a voltage measuring device electrically connected between the neutral of the transformer and the ground.

12. The protection circuit of claim 11, further comprising a control circuit connected to the voltage measuring device, wherein:
the transformer is connected to one or more power line phases, the one or more power line phases connecting the transformer to an electrical grid, and
in response to the voltage exceeding a threshold for a predetermined amount of time, the control circuit is configured to transmit an actuation signal to actuate one or more circuit breakers each electrically connected to a power line phase of the one or more power line phases to electrically disconnect the transformer from the electrical grid.

13. The protection circuit of claim 11, further comprising a control circuit connected to the voltage measuring device, wherein:
the transformer is connected to one or more power line phases, the power line phases connecting the transformer to an electrical grid, and
in response to a rate of change of the voltage that exceeds a predetermined rate of change, the control circuit is configured to transmit an actuation signal to actuate one or more circuit breakers each electrically connected to a power line phase of the one or more power line phases to electrically disconnect the transformer from the electrical grid.

14. The protection circuit of claim 11, further comprising a control circuit connected to the voltage measuring device, wherein:
the transformer is connected to one or more power line phases, the one or more power line phases connecting the transformer to an electrical grid, and
in response to a voltage detected by the voltage measuring device reaching a threshold, the control circuit is configured to transmit an actuation signal to actuate one or more circuit breakers electrically connected to the power line phases electrically disconnect the transformer from the electrical grid.

15. The protection circuit of claim 11, wherein the voltage comprises a direct current voltage.

16. The protection circuit of claim 1, further comprising a maintenance bypass switch electrically connected between the DC blocking component and the transformer neutral, the maintenance bypass switch being useable to decouple the DC blocking component from the transformer neutral during maintenance.

17. The protection circuit of claim 1, wherein the circuit lacks an electronically-controlled switch electrically connected along a path in parallel with the DC blocking component between the transformer neutral and the ground that is operated during normal operation of the protection circuit.

* * * * *